(12) United States Patent
Sommer et al.

(10) Patent No.: US 6,650,186 B1
(45) Date of Patent: Nov. 18, 2003

(54) CLOCK PULSE AND DATA REGENERATOR FOR DIFFERENT DATA RATES

(75) Inventors: Joerg Sommer, Munich (DE); Bernd Stilling, Munich (DE)

(73) Assignee: Siemens Aktiengesellschaft, Munich (DE)

( * ) Notice: Subject to any disclaimer, the term of this patent is extended or adjusted under 35 U.S.C. 154(b) by 4 days.

(21) Appl. No.: 10/129,051

(22) PCT Filed: Oct. 24, 2000

(86) PCT No.: PCT/DE00/03749

§ 371 (c)(1),
(2), (4) Date: Apr. 29, 2002

(87) PCT Pub. No.: WO01/33764

PCT Pub. Date: May 10, 2001

(30) Foreign Application Priority Data

Oct. 29, 1999 (DE) .......................................... 199 52 197

(51) Int. Cl.[7] ................................................ H03L 7/00
(52) U.S. Cl. .......................... 331/11; 331/17; 327/156
(58) Field of Search ............................... 331/10, 11, 12, 331/16, 17, 18, 23, 25; 327/156, 157, 158, 159; 329/302, 303, 307, 308, 309, 310, 311; 360/51; 375/376, 327, 328

(56) References Cited

U.S. PATENT DOCUMENTS

| 5,015,970 A | * | 5/1991 | Williams et al. ............... 331/11 |
| 5,216,387 A |   | 6/1993 | Telewski et al. |
| 5,512,860 A |   | 4/1996 | Huscroft et al. |
| 5,577,086 A |   | 11/1996 | Fujimoto et al. |
| 6,337,589 B1 | * | 1/2002 | Ooishi .......................... 327/156 |
| 6,545,546 B2 | * | 4/2003 | Takeshita et al. ............. 331/11 |

FOREIGN PATENT DOCUMENTS

| DE | 196 25 998 A1 | 1/1998 |
| DE | 197 04 299 A1 | 8/1998 |
| EP | 0 821 489 A2 | 1/1998 |
| EP | 0 844 738 A2 | 5/1998 |
| WO | WO98/38744 | 9/1998 |

OTHER PUBLICATIONS

Frequency Detectors for PLL Acquisition in Timing and Carrier Recovery, David G. Messerschmitt, pp. 107–114, 9–79.

* cited by examiner

*Primary Examiner*—Henry Choe
(74) *Attorney, Agent, or Firm*—Bell, Boyd & Lloyd LLC

(57) ABSTRACT

A clock and data regenerator for different data rates including a control loop which is controlled by a phase discriminator (PD) and two frequency discriminators. The first frequency discriminator enlarges the catchment range of the control loop. The second frequency discriminator determines the ratio of the bit rates of the clock signal and of the data signal. The second frequency discriminator sets the loop frequency divider appropriately, and supplies a control voltage for setting the oscillator until the first frequency discriminator can carry out this function.

18 Claims, 4 Drawing Sheets

FIG 4
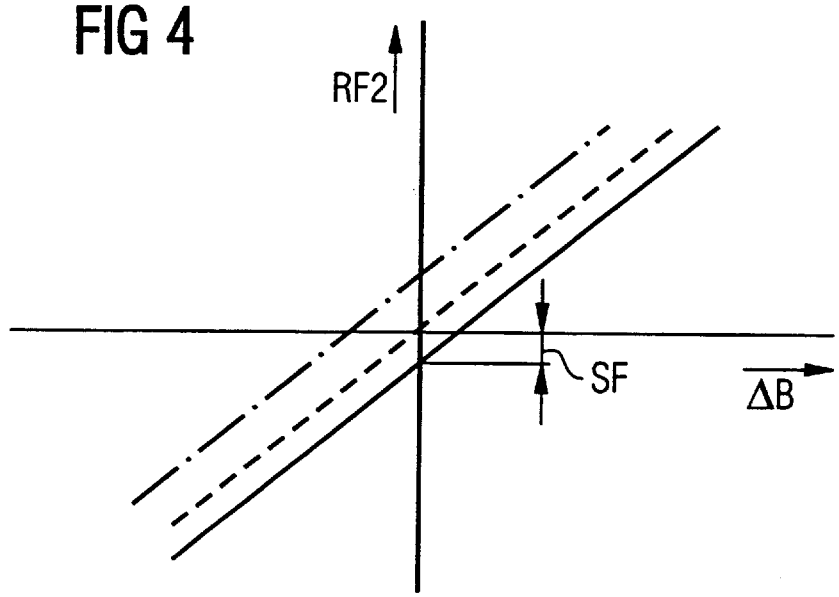
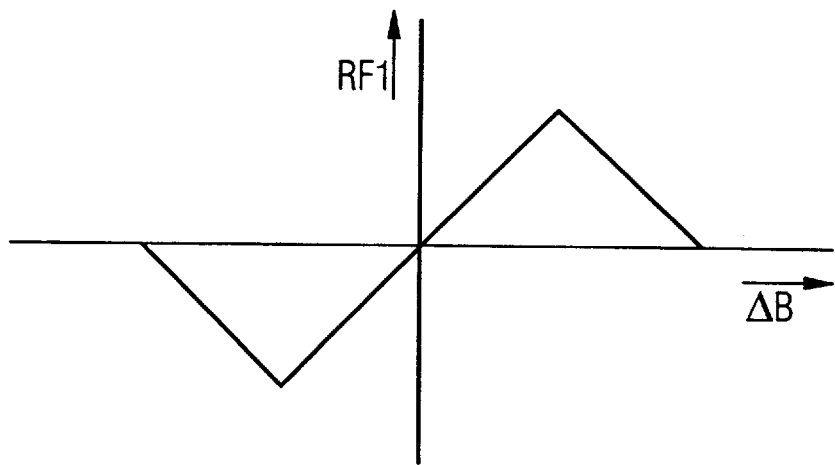
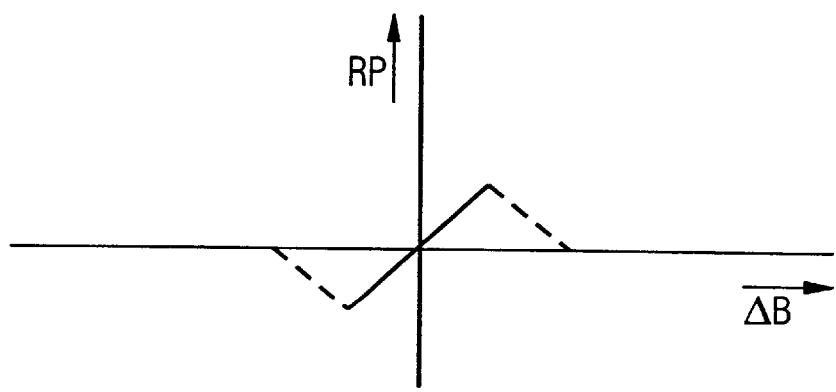

CLOCK PULSE AND DATA REGENERATOR FOR DIFFERENT DATA RATES

BACKGROUND OF THE INVENTION

The present invention relates to a clock and data regenerator for different data rates having a phase and frequency control device.

Phase locked loops are used in order to recover the clock signal from a received binary signal, and to obtain a regenerated data signal using this clock signal.

In a clock regeneration device, the control loop is chosen to have a narrow bandwidth so that the frequency and phase remain constant even in the event of a long sequence of zeros or ones. However, a stable phase locked loop has a very narrow catchment range. Thus, the clock recovery operates only in a very narrow frequency range (i.e., essentially only one quite specific bit rate).

A phase locked loop (PLL) which has a phase discriminator and a frequency discriminator is described in "Frequency Detectors for PLL Acquisition in Timing and Carrier Recovery" by David G. Messerschmitt, IEEE Transaction Communication, Vol. COM-27, pp. 1288–1295, September 1979. The frequency discriminator is first used to set the oscillator frequency approximately, and the phase angled between the clock signal that is produced and the data signal is then kept constant via the phase locked loop. In practice, these phase locked loops have a catchment range of approximately ±30% of the data signal frequency (bit rate).

If the clock regeneration is intended to be used for different data rates, then the catchment range of the PLL is frequently inadequate.

An apparatus for obtaining a clock signal from a data signal using a bit rate identification device for the received data signal is described in Laid-Open Specification DE 197 04 299 A1. The bit rate identification device is supplied with various reference signals, which allow the flank densities of the received data signal and of the reference signals to be compared. The result of this comparison is used to set a frequency divider in the feedback path such that the phase control becomes successfully effective. This apparatus is particularly suitable for a small number of bit rates, which are known at the receiving end.

SUMMARY OF THE INVENTION

An object of the present invention is, therefore, to provide a clock and data regenerator which reliably processes different bit rates of the data signal without any gaps. The clock and data regenerator is intended to be developed such that differently coded data signals can also be processed.

One advantage of the present invention is the universal applicability of the regenerator by virtue of its wide operating range. Generally, there is no need for a reference clock, but such a clock can be used in order to allow the frequency divider to be pre-set.

Another advantage is achieved by a further frequency discriminator, which sets a frequency divider arranged in the feedback loop of the control loop and adjusts a comparison frequency, which is obtained from the oscillator frequency, to such an extent that it enters the catchment range of the first frequency discriminator.

In an embodiment, the frequency divider is adjusted in steps while, in alternative embodiments which operate at higher speeds, the divider can be pre-set directly on the basis of the measurement results from the further frequency discriminator. The two frequency discriminators can, of course, be combined in the circuitry.

Additional features and advantages of the present invention are described in, and will be apparent from, the following Detailed Description of the Invention and the Figures.

BRIEF DESCRIPTION OF THE FIGURES.

FIG. 4 shows control characteristics for discriminators.

DETAILED DESCRIPTION OF THE INVENTION

Figure 1:
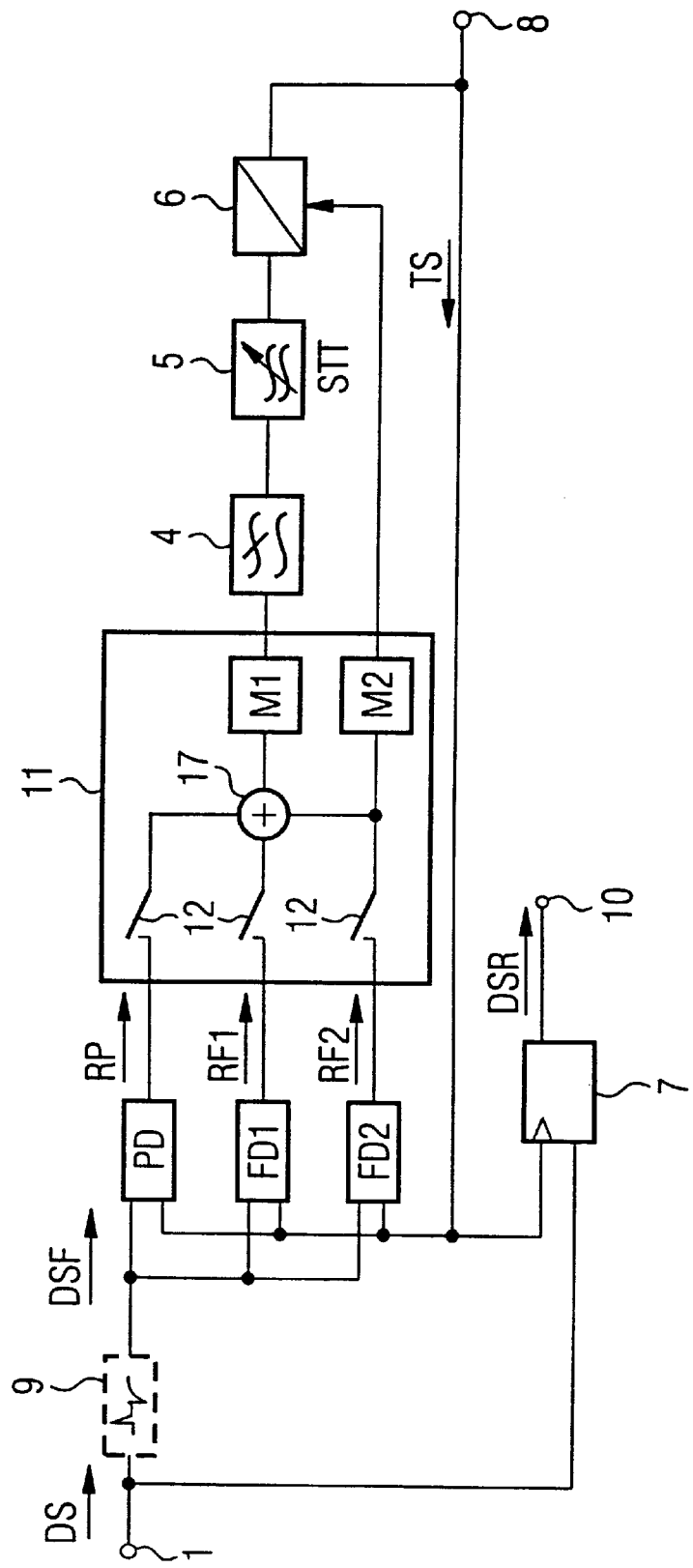
FIG. 1 shows a clock and data regenerator according to an embodiment of the present invention.

FIG. 1 shows the outline circuit diagram of an embodiment of a regenerator according to the present invention, which has frequency control and phase control.

The phase locked loop (PLL) is formed from a phase discriminator PD, a loop filter, a controllable oscillator 5 and a frequency divider 6, which produces a clock signal TS which is fed back to a second input of the phase discriminator PD. The data signal DSF is used as a reference signal. This may be the data signal DS received at the signal input 1, or a data signal DSF derived from this signal in a signal conditioning device 9. This signal conditioning converts each flank of the data signal to, for example, a positive flank. This may be expedient when the received data signal is an NRZ signal (non return to zero) and does not have the desired fundamental frequency. The frequency control is carried out by way of a first frequency discriminator FD1 and a second frequency discriminator FD2, to both of which the clock signal TS, which is emitted at the output of the frequency divider, is likewise supplied. The received data signal is also supplied to a decision maker 7, which samples it using the clock signal and emits it as a regenerated data signal DSR at the data output 10. The clock signal is available at a clock signal output 8.

A controller 11 is also provided, which controls resynchronization and switches the frequency divider 6 such that the nominal frequency of the clock signal can be reached by the pull-in range of the controllable oscillator.

Figure 2:
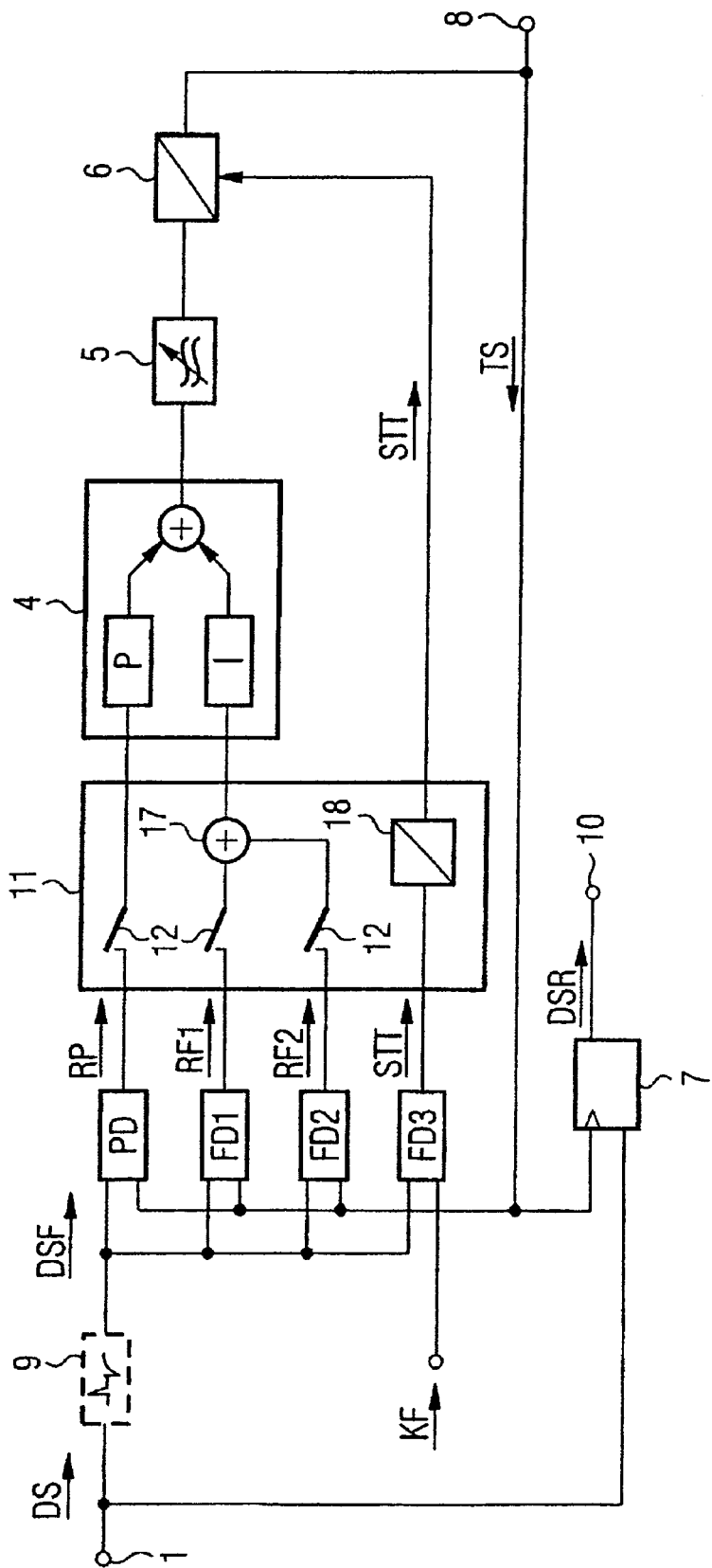
FIG. 2 shows an embodiment of a clock and data regenerator according to the present invention.

The function of the clock and data regenerator will be explained on the basis of an embodiment illustrated in FIG. 2. This embodiment has a third frequency discriminator FD3, to which an external reference signal KF is supplied. The frequency discriminator FD3 separately counts the number of flanks of the data signal DS and the number of flanks of the reference signal KF within a predetermined time period. It is advantageous to set the oscillator frequency approximately to the center of the pull-in range in advance. The controller uses the flank densities to determine the bit rate of the data signal and, initially, sets a division ratio for the frequency divider 6 for which the second frequency discriminator FD2 can at least roughly set the nominal frequency of the oscillator. The second frequency discriminator FD2 supplies (since there are generally even greater frequency differences between the reference signal and the clock signal after setting of the frequency divider) a control signal RF2 to the loop filter 4, which ensures further adaptation. The second frequency discriminator FD2 has an advantage of a very wide operating range. However, the second frequency discriminator FD2 may not be sufficiently accurate if the transmission code is unknown, and the probability of a data flank occurring is hence unknown.

Since the second frequency discriminator FD2 determines its control signal in the same way that the third frequency discriminator FD3 determines the bit rate of the data signal, the second frequency discriminator FD2 can also carry out its task.

The frequency discriminators FD2, FD3 ensure that the clock and data regenerator can operate reliably for widely differing data signal bit rates.

Figure 3:
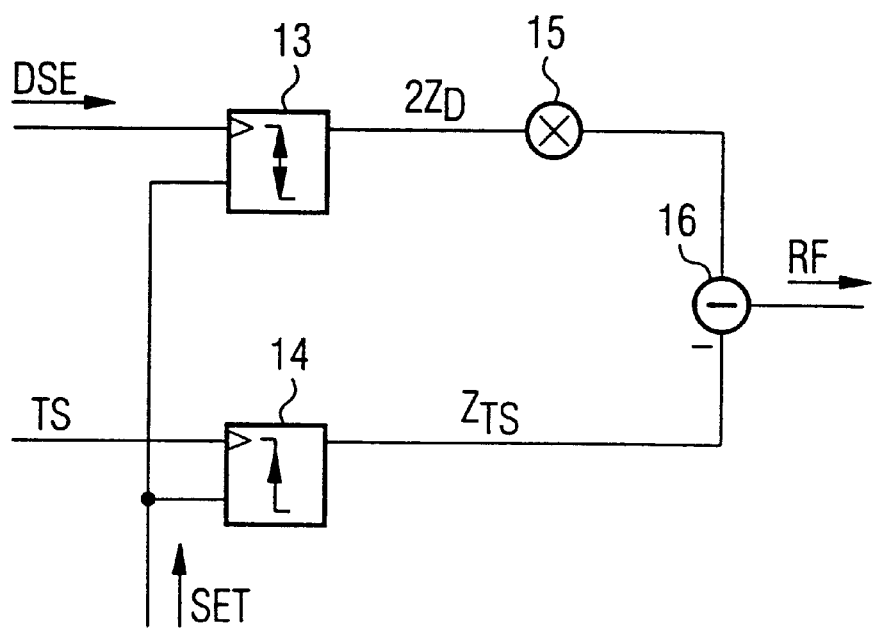
FIG. 3 shows an embodiment of a second frequency discriminator.

The function of the second and third frequency discriminators FD2, FD3 will now be explained in more detail. FIG. 3 shows an associated block diagram that illustrates a first counter 13, whose clock input is supplied with the data signal flanks (in each case one pulse for each positive and negative flank of an NRZ signal), and a second counter 14, which counts each positive flank of the clock signal TS (further counters may also be positioned upstream of these counters, so that only each n-th flank is counted). At the end of one counting period, the results are subtracted from one another in a subtractor 16, in order to obtain a control criterion which is dependent on the frequency difference $\Delta B$. The counters 13, 14 are then reset using a set pulse SET. A multiplier 15 (which is positioned downstream from one of the counters) can act as a correction element in order to slightly correct the count result of the signal flank counter. With stochastic NRZ data, the probability of the occurrence of a data flank is 0.5 per bit. A control criterion $RF2=2Z_D-Z_{TS}$ can be obtained by the second frequency discriminator by forming the differences between the count values of the data flanks and of the positive clock flanks.

The bit rate is $B_s=2Z_n/T$, where T is the measurement time, based on the probability that the occurrence of a data flank is 0.5.

The measurement error is dependent on the number of measured bits, or on the measurement time. Furthermore, the probability of the occurrence of a data flank is exactly 0.5 only with stochastic NRZ-coded data. For normal transmission codes, the expected value for the occurrence of a step changeover is, however, between about 0.5 and about 0.625 per bit for CMI code. Thus, it is possible for there to be a systematic measurement error SF, depending on the code. The top of FIG. 4 shows the characteristics for various codes. The solid characteristic shows the systematic measurement error SF of the control signal. If a mean expected value of about 0.5625 is assumed, then the error is somewhat more than 10%. The second frequency discriminator thus indicates that the frequency control has a sufficient margin in order to achieve the catchment range of about±30% of the data rate of the first frequency discriminator. A corresponding situation applies to the divider setting by way of the third frequency discriminator.

The controller 11 can use the count result to set the frequency divider in the control loop on the basis of a stored table 18.

Other embodiments, including analog embodiments, are also, of course, feasible for the second and third frequency discriminators.

The pull-in range of the oscillator and the setting steps of the frequency divider must be matched to one another. It must always be possible to vary the oscillator frequency sufficiently that the second frequency discriminator FD2 is sufficient for rough frequency control, until the first frequency discriminator FD1 can then carry out the fine frequency adjustment. If the oscillator can be tuned, for example, over one octave, then it is possible to use a frequency divider which can be switched in binary steps. The feasibility to switch off the output signals from the frequency discriminators depends on the embodiment and the dimensioning.

Once the frequency has been set roughly by the frequency control signal RF2, the first frequency discriminator FD1 supplies a control signal RF1 for a further approximation of the frequencies by the data signal and clock signal until the catchment range of the phase discriminator PD is reached. To this end, the first frequency discriminator FD1 compares the reference signal (data signal) and the comparison signal derived from the oscillator, the clock signal TS, and normally emits a frequency control voltage RFI which is proportional to the frequency difference $\Delta B$.

If the loop is locked in with locked phase angles, then it is advantageous to switch off the frequency discriminators (via a switching device 12 in FIGS. 1 and 2) since, otherwise, the phase jitter, which can likewise be perceived as a frequency change, via the loop filter would result in additional control signals being supplied to the oscillator. Instead of switching off the control signals, a suitable design of the frequency discriminators can also be used to ensure the same effect.

In order to achieve an optimum control response for the design of the PLL, it is advantageous for the loop filter to have a proportional path P for the phase discriminator and at least one integral path I for the frequency discriminators, whose output signals are combined by an adder 17. In order to satisfy the stability conditions required for data transmission, the filter parameters can be switched as a function of the data rate.

The controller 11 can be equipped with a memory M1, M2, which keeps the setting of the PLL constant if the data signal fails. Thus, resynchronization takes place very quickly.

A method of operation of the control process will be explained with reference to the control signals and FIG. 4. If the bit rate errors are large, the frequency control signal $RF2=Z_{D-ZTS}$ of the second frequency discriminator FD2 readjusts the frequency of the oscillator as a function of the difference $\Delta B$ in the bit rates between the data signal and the clock signal until the catchment range of the first frequency discriminator FD1 is reached. The amplitude becomes zero, and the frequency control signal RF2 is switched off. The frequency control signal RF1 of the first frequency discriminator FD1 then ensures accurate matching of the frequencies, until the phase control is carried out by the phase control signal RP of the phase discriminator PD.

The analyses described above are based on an objective measurement of the bit rate using a constant reference signal. However, this is not essential. In fact, in accordance with the embodiment illustrated in FIG. 1, it is also possible to use the one output clock of the frequency divider 6 (i.e., the clock signal TS) as a reference signal. The second frequency discriminator FD2 then compares the clock signal with the digital signal DSF, and once again passes on the control signal to the controller 11. The controller 11 knows the current divider setting and allows operation of the control loop at the bit rate of the applied data signal. Thus, the controller can set the frequency divider directly.

The frequency divider setting can also be carried out successively, for example, by checking the control signal determined by the second frequency discriminator. The setting of the frequency divider 6 is varied in steps as a function of a positive or negative result going beyond a threshold value. The control signal of the oscillator 5 can, of course, also be used as an equivalent measurement variable and can also be used to adjust the frequency divider 6 in the control cut-off region such that the operating frequency of the oscillator is well away from the limit, for example, such that it is moved approximately to the center of the pull-in range. Such a limit situation can occur if the division ratio of the frequency divider has been set to a poor value owing to the systematic error.

Although the present invention has been described with reference to specific embodiments, those of skill in the art will recognize that changes may be made thereto without departing from the spirit and scope of the invention as set forth in the hereafter appended claims.

What is claimed is:

1. A clock and data regenerator for different data rates, comprising:
    a phase discriminator;
    a first frequency discriminator, a data signal being supplied as a reference signal to both the phase discriminator and the first frequency discriminator
    an oscillator;
    a loop filter driving the oscillator;
    a frequency divider in a feedback path, an output signal from the frequency divider supplying a comparison signal to both the phase discriminator and the first frequency discriminator; and
    at least one second frequency discriminator which compares a bit rate of the data signal to the output signal from the frequency divider, a comparison result of the second frequency discriminator supplying both a first control signal for controlling a division ratio of the frequency divider and a second control signal which, after being filtered by the loop filter, controls the oscillator.

2. A clock and data regenerator as claimed in claim 1, wherein the division ratio of the frequency divider is one of reduced and increased based on the comparison result of the second frequency discriminator.

3. A clock and data regenerator as claimed in claim 1, wherein the division ratio of the frequency divider is set based on the comparison result of the second frequency discriminator.

4. A clock and data regenerator as claimed in claim 1, further comprising a controller, the controller converting the comparison result of the second frequency discriminator to the first control signal that controls the division ratio of the frequency divider, the controller also converting the comparison result to the second control signal which, after being filtered by the loop filter, controls the oscillator.

5. A clock and data regenerator, comprising
    a phase discriminator;
    a first frequency discriminator, a data signal being supplied as a reference signal to both the phase discriminator and the first frequency discriminator;
    an oscillator;
    a loop filter driving the oscillator;
    a frequency divider in a feedback path, an output signal from the frequency divider supplying a comparison signal to both the phase discriminator and the first frequency discriminator;
    a second frequency discriminator which compares a bit rate of the data signal to the output signal from the frequency divider, a comparison result of the second frequency discriminator being converted to a second control signal which, after being filtered by the loop filter, controls the oscillator; and
    a third frequency discriminator to which a constant reference signal is supplied to determine the bit rate of the data signal, a comparison result of the third frequency discriminator being converted to a first control signal for controlling a division ratio of the frequency divider.

6. A clock and data regenerator as claimed in claim 5, further comprising a controller, the controller converting the comparison result of the third frequency discriminator to the first control signal for controlling the division ratio of the frequency divider, the controller also converting the comparison result of the second frequency discriminator to the second control signal which, after being filtered by the loop filter, controls the oscillator.

7. A clock and data regenerator as claimed in claim 5, wherein the reference signal is periodically supplied to the second frequency discriminator to determine values for setting the frequency divider.

8. A clock and data regenerator as claimed in claim 5, wherein the second frequency discriminator and the third frequency discriminator assess step changeovers of the data signal in comparison to step changeovers of one of a clock signal, the reference signal or time to determine one of the first control signal or the second control signal.

9. A clock and data regenerator as claimed in claim 5, wherein at least one of the second frequency discriminator and the third frequency discriminator includes a correction element for correcting a measured data rate of the data signal.

10. A clock and data regenerator as claimed claim 5, wherein a control signal of at least one of the frequency discriminators is one of switched off and not emitted in a region of a nominal position.

11. A clock and data regenerator as claimed in claim 5, further comprising a setting device for setting the oscillator to a mid-frequency within a pull-in range of the oscillator, for resynchronization.

12. A clock and data regenerator as claimed in claim 5, wherein a loop filter is provided for each discriminator, the loop filter being in the form of one of an integrator and a filter with an integral component.

13. A clock and data regenerator as claimed in claim 5, further comprising a binary-adjustable frequency divider, wherein the oscillator includes a pull-in range of at least one octave.

14. A clock and data regenerator as claimed in claim 5, further comprising a storage device for storing setting values of at least one of the frequency divider and the oscillator, the setting values being used as start values for resynchronization.

15. A clock and data regenerator as claimed in claim 5, wherein the loop filter has a proportionality path to which a control signal of the phase discriminator is supplied, and the loop filter has at least one integral path to which a control signal of at least one of the frequency discriminators is supplied.

16. A clock and data regenerator as claimed claim 5, wherein filter parameters for the loop filter are set as a function of a data rate.

17. A clock and data regenerator as claimed in claim 5, further comprising a correcting device for correcting a setting of the frequency divider when a pull-in range of the oscillator reaches a limit value.

18. A clock and data regenerator as claimed in claim 5, wherein signal conditioning converts a received data signal to the data signal, the data signal being derived from received data signal at a fundamental frequency of a data rate.

* * * * *